METHOD OF MAKING MULTILAYER PRINTED CIRCUITS

Filed July 22, 1969

4 Sheets-Sheet 1

INVENTOR.
JOSEPH F. DEGNAN

BY M. LuKacher ATTY

INVENTOR.
JOSEPH F. DEGNAN

BY M. LuKacher ATTY

April 4, 1972 J. F. DEGNAN 3,654,097

METHOD OF MAKING MULTILAYER PRINTED CIRCUITS

Filed July 22, 1969 4 Sheets-Sheet 3

INVENTOR.
JOSEPH F. DEGNAN

BY

April 4, 1972 J. F. DEGNAN 3,654,097

METHOD OF MAKING MULTILAYER PRINTED CIRCUITS

Filed July 22, 1969 4 Sheets-Sheet 4

INVENTOR.
JOSEPH F. DEGNAN

BY M. L. Kacher ATTY

United States Patent Office 3,654,097
Patented Apr. 4, 1972

3,654,097

METHOD OF MAKING MULTILAYER PRINTED CIRCUITS

Joseph F. Degnan, Webster, N.Y., assignor to General Dynamics Corporation

Filed July 22, 1969, Ser. No. 843,434
Int. Cl. C23b *5/48;* B41m *3/08;* B44d *1/18*
U.S. Cl. 204—15 11 Claims

ABSTRACT OF THE DISCLOSURE

Improved methods of fabricating multilayer printed circuit boards are described wherein at least one exposed circuit face is prefabricated before the boards are laminated together by means of a non-flowing "B" stage epoxy glass sheets and in a fixture having flowable material confined on opposite sides of the package (viz the layers to be laminated), thereby permitting the use of such non-flowing material which reduces shrinkage, improves lamination quality, maintains registration among the boards, and simplifies fixturing. The lamination packages may also include a vinyl phenolic glass cloth layer which is laminated on one side. Also during the process an acrylic resin protective coating is applied which together with the vinyl phenolic layer, provides selectively removable masks which facilitate removal of electroless surface plating on exposed circuit faces and drilling holes through the boards. Thereafter, plated connections are provided via the holes between the circuits on the boards.

The present invention relates to multilayer printed circuits and methods of making same and particularly to multilayer circuits having plated through holes for providing connections between the circuits on the various layers and techniques for the fabrication of such circuits with very close registration tolerances and high density of the plated through holes.

The invention is especially suitable for use in providing printed circuit boards having four or more layers which serve as connections between integrated circuit devices or as mother boards. The features of the circuits and the processes of manufacturing them will, however, be applicable to the construction of miniature and microelectronic equipment using discrete components which may be operable in various frequency ranges.

Although many techniques for fabricating multilayer printed circuit boards have been proposed, each has several drawbacks and is very yield limited. In addition, a great deal of manual operations are involved, particularly in the detection of defective boards. Conventional multilayer board processes are not readily adaptable for volume production. The low yield, prolonged process time, uncertainty as to quality of internal portions of the board and the extensive skilled labor required in production make conventional multilayer boards very expensive.

In a conventional multilayer board, circuit patterns are normally etched only on one side of the boards used for the inner layers. Circuit on circuit lamination is precluded because of limitations in the bonding process since often times the bonding material will flow from between adjacent conductive areas causing inferior bonds (say when glass on glass conditions exist) and possible short circuits under conditions of minimal dielectric spacing. The number of layers which can be provided in a relatively thin multilayer board is therefore limited.

It is a feature of this invention to provide multilayer printed circuit boards having bonding layers which resist flow during the lamination cycle, thereby providing improved lamination strength, improved circuit to circuit registration and which permit reliable circuit lamination.

The density of plated through holes on conventional multilayer printed circuit boards is also limited, principally because the tolerances cannot be maintained during the fabrication process. For example, during lamination, pressure differentials resulting from non-parallelism between the platens of the press as well as sheer stresses due to flowing of bonding materials give rise to misregistration among the various layers. Holes cannot be spaced closer than a worse case condition to allow for misregistration.

It is a feature of this invention to provide multilayer printed circuit boards and methods of making same which may be controlled to high tolerances, thereby permitting very high density of holes, and consequently greater flexibility in the number of circuits which may be provided with a single multilayer circuit board.

Conventional processes of fabricating multilayer boards generally include the step of drilling the holes which are subsequently plated through to provide connections through a blank face (usually a continuous sheet of copper on which a circuit is later etched). Drilling must therefore take place blindly without alignment checks. Lamination quality cannot be ascertained. For example, misregistration will not be detected. The drilling process may also tear the circuit pattern. Careful inspection of the drilled assemblage must be conducted to guard against defects. Circuits are not prefabricated upon the exposed face since plating of through holes requires electroless copper deposition which would adhere to exposed substrates on the exposed face. Chemical etching also used in the plated through hole fabrication process would damage the exposed circuit face. A disadvantage of conventional processes where the exposed face circuit pattern is fabricated after drilling of the through holes and copper plating is the possibility of contamination of the through holes by resist which consequently prevents good plating in the holes and can cause open circuits in the holes. The cost of the preparation of circuits after drilling is high.

It is a feature of this invention to provide a prefabricated circuit pattern on the exposed face prior to drilling of the through holes. In accordance with this feature, a mask which also precludes tearing of the circuits during drilling without contaminating the holes and which also precludes the adherence of the electroless copper deposit and etching solutions is provided. It is an ancillary feature of this invention that at least one mask is fabricated during the lamination process, thereby saving a process step. Another feature of the masks is that they are adapted to be selectively removed; thus one mask can prevent damage to the board and aid in the drilling process while being removable separately from the other mask so as not to interfere during the plating or in latter stages of the process. Application of resist after drilling is eliminated when finished boards have only one exposed circuit. In order that the holes may be plated, electrical continuity is required to the plating circuitry.

It is a feature of this invention to provide a sheet or layer of conductive material which is laminated on one surface of the assemblage of boards and which provides effective continuity to each hole so as to support plating. An ancillary feature is the lamination of one of the masks over the conductive layer which may be removed either prior to plating so as to permit a pattern to be provided on the conductive layer; or, in the event that the conductive layer is removed completely, the masks may be removed after solder plating so as to prevent any contamination of the conductive layer which would prevent it from being etched away completely.

Accordingly, it is an object of the present invention to provide improved multilayer circuits and methods of making same.

It is another object of the present invention to provide improved methods of laminating the layers of a multilayer circuit board so as to reduce misregistration of printed patterns among the layers.

It is still another object of the present invention to provide improved multilayer circuit boards which have higher density of adjacent layers of circuitry than heretofore available commercially.

It is still another object of the present invention to provide improved multilayer circuit boards having high density of plated through holes which permits the plated through holes to be located very close together.

It is a still further object of the present invention to provide improved multilayer printed circuit boards with a conformal coating upon at least one of its exposed printed circuit patterns which may be applied during the lamination process.

It is a still further object of the present invention to provide an improved process for manufacturing multilayer circuit boards wherein drilling or through holes does not damage the circuits on boards or interferes with the application of conductive material therein.

It is a still further object of the present invention to provide an improved method of making multilayer printed circuit boards wherein large numbers of boards can be produced in each batch.

It is a still further object of the present invention to provide an improved method of manufacturing high quality multilayer printed circuit boards at reduced cost.

It is a still further object of the present invention to provide multilayer printed circuit boards having consistently high interlaminar bond strength.

It is a still further object of the present invention to provide an improved fixture for assembling layers of multilayer circuit boards for lamination which applies conformal pressure thereto so as to facilitate the lamination process and which provides close tolerance and predictable board thicknesses and reduces internal stresses.

It is a still further object of the present invention to provide improved fixtures for assembling the layers of multilayer printed circuit boards for lamination which have removable parts such that packages of laminates may be assembled while lamination of other packages is taking place thereby saving time and labor.

It is a still further object of the present invention to provide an improved fixture for lamination of printed circuit boards which can be set up in a short amount of time.

It is a still further object of the present invention to provide an improved method of laminating multilayer circuit boards wherein the criticality of lamination parameters, such as lamination time, gel state and pressure is reduced or substantially eliminated.

It is a still further object of the present invention to provide an improved method of manufacturing multilayer printed circuit boards at reduced cost such that the boards themselves are less expensive than boards produced by conventional processes which have been heretofore available.

Briefly described, an improved multilayer printed circuit board embodying the invention includes a plurality of single or double sided printed circuit boards; a layer of non-flowing "B" stage epoxy glass is provided between the layers such that they may be laminated together without misregistration. A layer of such "B" stage material may be provided on the exposed surface of a board so as to provide a conformal coating over the circuits thereon.

The process of making the multilayer boards includes the steps of providing selectively removable masks. One of these masks may be a sheet of vinyl phenolic glass cloth which is applied to one side of the assemblage of boards during lamination thereof. The other mask may be an acrylic resin coating. The masks may be selectively removed at different stages in the process so as to protect, during drilling, the circuits on the outer sides of the boards.

The masks also prevent burrs from being formed during drilling, protect circuit substrates against chemical etching and avoid deposition of conductive deposits on exposed circuit substrates. One of the masks may be removed prior to plating of the through holes while the other may be removed either prior to or subsequent to plating.

A conductive layer may be provided in the assemblage of boards prior to lamination, and located between the surface of one of the boards and the mask which is laminated with the assemblage. This layer is utilized to provide electrical continuity during plating of the through holes.

The invention itself, both as to the organization and method of operation, as well as additional objects and advantages thereof, will become more readily apparent from a reading of the following description in connection with the accompanying drawings in which.

Figure 1:
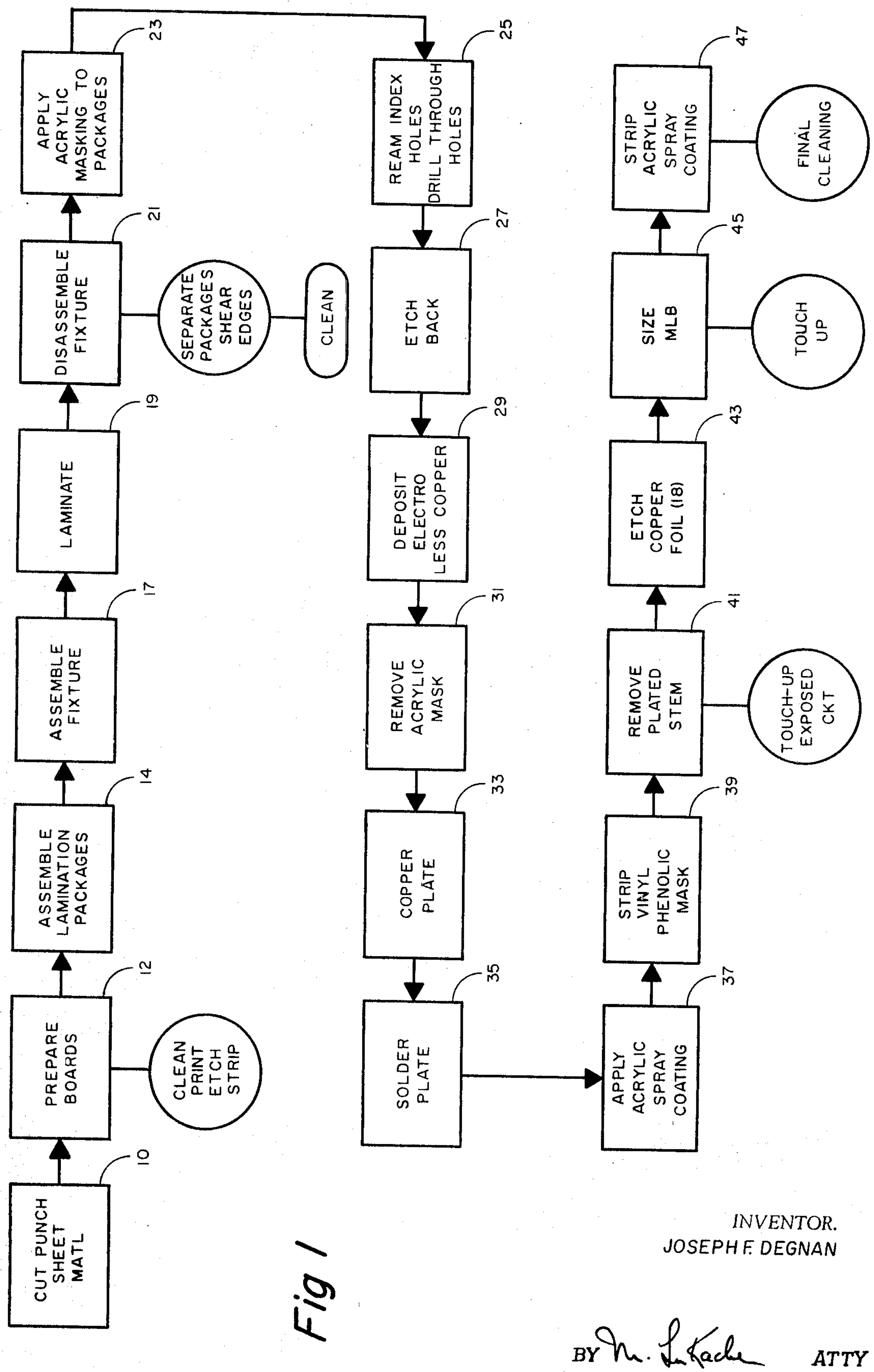
FIG. 1 is a flow chart showing the steps employed in accordance with the invention to make a multilayer printed circuit board which embodies the invention.

Referring more particularly to FIG. 1, there is shown the sequence of steps used to make an epoxy glass multilayer printed circuit board according to the invention. In the first step 10, the sheet material from which the boards are made is first cut into blanks. Index or alignment holes are punched in the blanks. The individual boards on which the circuits are provided have a substrate of cured epoxy glass which is clad with copper generally on both sides. During the cutting and punching step 10, these copper clad sheets are desirably punched individually to provide the alignment holes therein. The other materials may be cut into blanks during this step 10.

The next step 12 involves the preparation of the printed circuits on the individual copper clad epoxy glass boards. An individual board may be completely etched free of copper and used as a dielectric spacer to insure symmetry of spacing and overall thickness. In a preferred embodiment of the invention, the copper cladding which is employed for circuits is 0.018 inch in thickness while the copper clad material which is used as a spacer is 0.01 inch in thickness. The circuits are provided on the individual boards in accordance with conventional printed circuit preparation techniques.

To this end, the copper clad materials is cleaned. After cleaning, photo resist is applied on the copper surfaces and the resisted pieces are exposed thereby printing the circuits on the boards. After exposure, the work is developed. Then the circuits are etched and the resist is removed from the circuit pattern by a chemical solvent or other stripper.

In the next step 14 a package of the copper clad board with the circuits thereon and the other sheets are assembled into a package for lamination. Assembly is accomplished over pins 15 which extend to the alignment holes in the boards and sheets. These pins 15 are shown as assembled in a lamination fixture in FIG. 3. The order in which the sheets are assembled into each of the lamination packages is depicted in FIG. 4. The uppermost layer is a sheet 16 of vinyl phenolic glass cloth. This sheet 16 serves as a mask in later steps of the process. This sheet may in a preferred embodiment of the multilayer board be 0.007 inch thick and is desirably semi-cured to "B" stage. Specifically, the sheet 16 material is a glass cloth supported vinyl phenolic film which is generally used as a structural adhesive. Suitably it has a resin content of about 35% by weight and a volatile content of 4% to 7.5% by weight.

The next layer is a sheet of rolled copper foil 18. Preferably this sheet is 0.001 inch thick and is etched in a fresh ammonium persulphate solution of 1.5 pound per gallon concentration for two minutes, rinsed in cold water for ten seconds, and then again etched in a 10% sulphuric acid solution for 20 seconds. The sheet is finally rinsed in warm water and dried by being heated for ten minutes. The preparation of the copper foil sheet 18 may be accomplished at the same time as the individual boards are prepared during the previous step 12. The next two layers are provided by the sheets 20 and 22 of significantly non-flowing B stage epoxy glass cloths. These sheets are preferably 0.004 inch thick. Specifically, the sheets are a woven glass fabric which is pre-impregnated with a non-flowing epoxy resin which is partially cured to B stage. The sheets 20 and 22 desirably have a high inter-laminar bond strength. The resin content of the sheets may be from 55% to 65% by weight. The volatile content is desirably a maximum of 0.5% by weight.

The use of significantly non-flowing B stage sheets to laminate the other layers together is an important feature of the invention. When the process is completed, the B stage sheets 20 and 22 will provide a conformal coating over one of the exposed printed circuits (viz the printed circuit 004 located on on one side of the multilayer board).

A principal problem in the manufacture of multilayer boards is maintaining precise registration among the various layers. Misregistration is usually caused by slippage between the various layers. Since the epoxy glass cloth layers 20 and 22 are non-flowing, sheer stresses which would ordinarily be set up due to flow are eliminated. If the layers slip, there is no assurance that the holes to be drilled will be properly aligned with circuit areas to be inter-connected and will avoid circuit paths which are not to be connected. In other words, lamination registration is necessary to provide circuit to circuit alignment after laminating. Differential pressures caused by lateral sheer forces produced by flowing resin are avoided by the use of the non-flowing B stage material.

Inasmuch as the material is non-flowing, the parallelism between the platens in the press and conformal pressure upon the package must be insured so as to provide uniform pressure distribution across the work. The necessary parallelism and conformal pressure are maintained by means of flowable material which is disposed over the assembled packages and below the fixture when the fixture is assembled in the press for lamination. These materials and techniques will be discussed in connection with FIG. 3.

Another advantage arising out of the use of the non-flowing B stage adhesive sheet is better laminating process control, which is a function of fixture temperature. The process is not dependent upon observation and manual control. With flowable adhesive sheets, pressure must be maintained during the time of critical polymerization. Otherwise improper bonding will result which may be due to resin starvation as when full pressure is applied too soon, and which may be due to entrapment of volatile material, as when pressure applied at a time too late to allow for the escape of volatile substances. Optimum dwell time varies appreciably with age of conventional flowing "B" stage epoxy glass. The use of the non-flowing "B" stage epoxy glass cloth in combination with conformal pressure reduces lamination imperfections such as voids, particularly about areas of high copper density and portions outward from the center area, which occur in conventional processes.

A two-sided circuit board 24 is next in the package. The etched circuit 004 is provided on the top of the board and the etched circuit 003 on the bottom thereof.

The next layer is a sheet 26 of non-flowing "B" stage epoxy glass cloth, preferably .004 inch thick which is similar to the "B" sheets 20 and 22. The succeeding layer is provided by a spacer layer of epoxy glass 28, preferably the 0.01 inch substrate from which copper cladding was etched during the board preparation step 12.

Another sheet 30 of non-flowing "B" stage epoxy glass cloth provides the next layer. The final layer is another circuit board 32 of epoxy glass which has the etched circuits 002 on one side thereof and the prefabricated, etched exposed surface circuit 001 on the opposite side thereof. The exposed circuit 001 is formed with pads through which the holes will be drilled. Since the circuit side of the board and the pads are visible, drilling is not done blindly; moreover, the drilling may be accomplished manually, if economical, rather than by a numerically controlled drill, the movement of which is referenced to the index holes.

Figure 3:
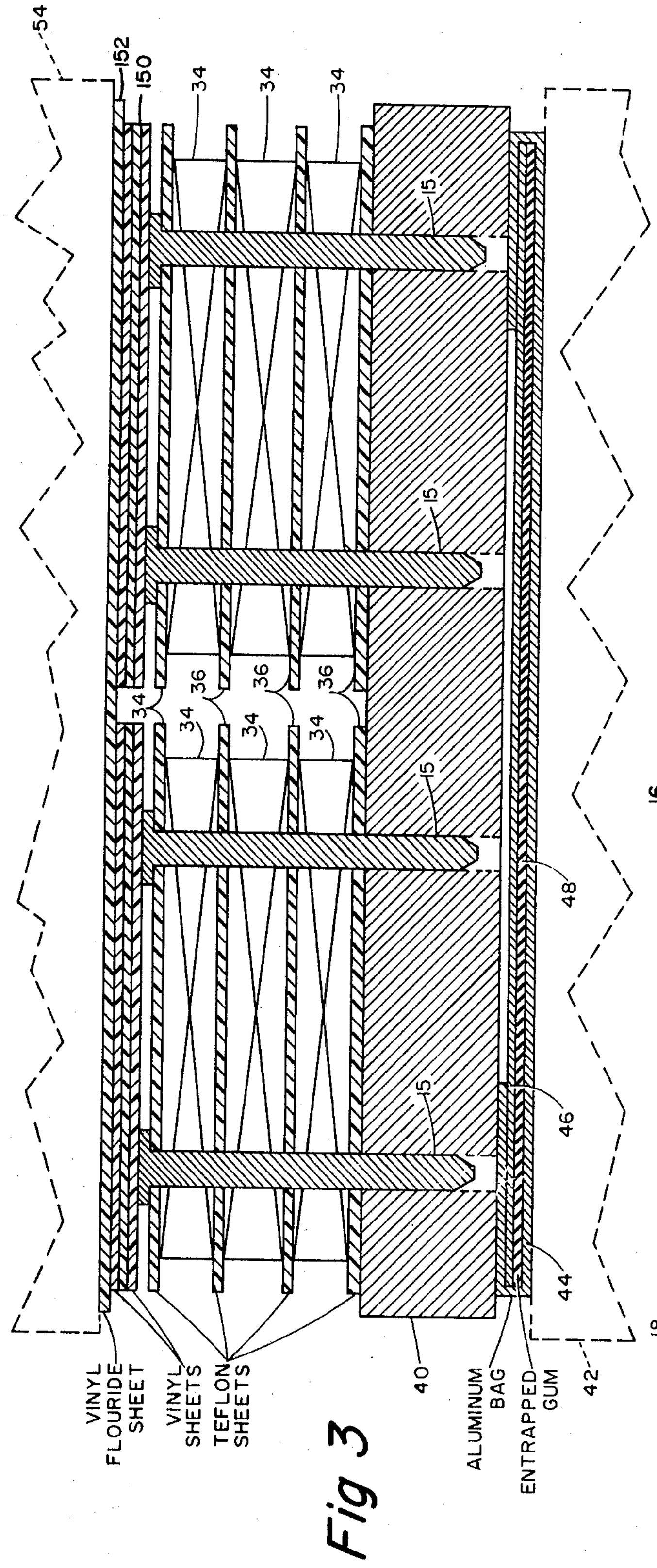
FIG. 3 is a sectional view of a fixture for laminating multilayer printed boards in accordance with the invention.
Figure 4:
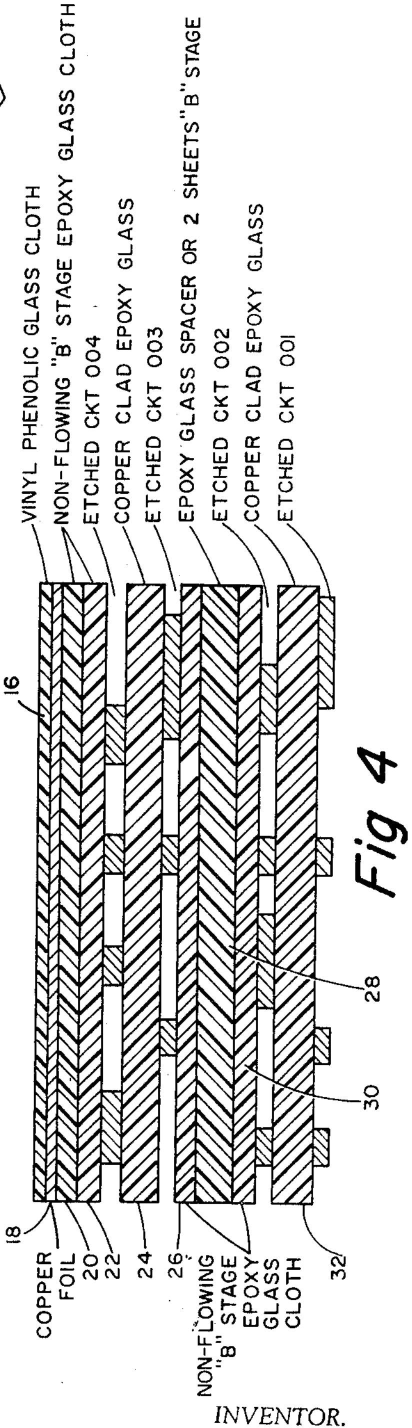
FIG. 4 is a sectional view of a package of single and double sided printed circuit boards together with sheets of material which laminate the boards together as well as other layers which may be laminated together in a fixture such as shown in FIG. 3 so as to make a multilayer printed circuit board in accordance with the process depicted in FIG. 1.

In step 17, the fixture shown in FIG. 3 is assembled. It was mentioned above that the fixture included a plurality of alignment pins 15. These are flanged at one end. Three lamination packages 34 are assembled over the pins. The packages are separated by sheets of polytetrafluoroethylene which is sold under the trade name Teflon by E. I. du Pont de Nemours, Inc. of Wilmington, Del. The sheets are desirably 0.031 inch thick and permit the packages to be readily disassembled since they prevent adjacent packages from being laminated to each other. The uppermost one of the Teflon sheets 36 prevents adherence to the flanged ends of the pins 15 while the bottom-most sheet 36 prevents adherence to a plate 40 which forms the base of the fixture. An important feature of the use of the alignment pins 15 in the fixture is that they permit the assembly of the packages separately from the fixture. A number of packages may be assembled over the pins during the lamination cycle by the same operator who is responsible for the operation of the lamination press. Thus, the fixture permits efficient utilization of operator time and thereby reduces cost. While two groups of three packages 34 are shown as being laminated at one time in the fixture, it may be desirable to only laminate more or less packages, say one to four, in each group at one time depending upon the volume of production which is required. More groups may also be laminated. Multiple package lamination, say up to 18 packages per cycle, is readily accomplished. Such multiple package lamination is made possible through the use of conformal pressure which permits utilization of the entire platen area.

Between the lower platen 42 of the press and the bottom of the fixture plate 40 there is provided a pad 44 of pressure equalizing material. This pad includes a sheet 46 of an elastomeric gum material which flows much like a lqiuid in confinement when heat and pressure are applied thereto. The sheet 46 is entrapped in an aluminum bag 48 which is made out of two pieces of aluminum foil; the lower one of which is folded over the upper to provide the bag 48. Suitable material for the sheet 46 is the "Press to Flo" material sold by the Bloomingdale Rubber Division of the American Cyanamid Company, Harve de Grace, Md. The bagged gummy sheet 48 has the additional feature of reducing the heat input rate to the packages after insertion in the press and thereby increases the working time available before the press must be closed. In other words, the press may be initially heated but the time for the fixture to come up to temperature when the press must be closed is extended by virtue of the insulation provided by the bag 46. A number of sheets 150 of vinyl material is placed over each assembly of packages for the purpose of pressure equalization on the opposite sides of the packages. A sheet 152 of vinyl fluoride material is placed over both groups of packages and separates the upper platen of the press from the vinyl sheets and prevents them from adhering them to the upper platen 54. The vinyl sheets may be 0.20 inch thick. The material sold under the trade name "Krene" type KDA 2076 by the Union Carbide Company is suitable. The vinyl fluoride sheet may suitably be about 0.001 inch thick.

The lamination step 19 follows the step 17 of assembling the fixture. As mentioned above, the temperature of the fixture plate 40 is used as a process control factor. When the temperature reaches about 200° F., the pressure is applied slowly until it reaches a value of about 250 p.s.i. The pressure is applied during an interval from 5 to 10 seconds, and maintained under heat for about 40 minutes. Then the press is allowed to cool until the temperature of the platen falls to below 100° F. The pressure is then removed and the fixture is taken from the press.

The next process step 21 is the disassembly of the fixture 21. The vinyl and vinyl fluoride sheets 150 and 152 are removed from the top of the package. The fixture is then turned over and the pins 15 are removed. The packages are disassembled by separating the Teflon spacers from the laminated boards. Visual circuit to circuit registration can now be easily checked. The boards are then cleaned and the edges sheared to provide smooth flat edges. It should be noted that the Teflon sheets 34 and the vinyl fluoride sheet 152 are reusable for several lamination cycles. Inasmuch as the vinyl sheets 150 flow during lamination, they must be replaced in each lamination cycle. The aluminum bag 48, however, may also be reused several times before it finally ruptures. It may be noted that the post cure step has been eliminated. This advantage enures from the use of the significantly non-flowing B stage materials as the bonding sheets 20, 22, 26 and 30 together with uniform and low lamination pressure afforded by conformal pressure laminations.

In the next step 23, a coating of plastic material is applied to the laminated packages to provide a second mask. This coating is preferably a clear fast drying acrylic resin material which is applied by dipping the laminated boards into a bath of the coating material. The bath is formulated of one part by volume acrylic resin and one part by volume of a suitable solvent such as xylene. A suitable acrylic resin is Humiseal 1B15 sold by Columbia Technical Corporation of Whitestone, N.Y. The acrylic material is desirably clear in color and has a solids content of about 35% by weight.

The acrylic mask and the vinyl phenolic layer 16 provide a pair of masks which are selectively removable at different stages in the process. Specifically, the vinyl phenolic layer is a solder mask while the acrylic coating masks the electroless copper solution from adhering to the laminated package and prevents damage to the prefabricated circuit during etchback. The masks are compatible with selective removal since the solvent which is used to remove the acrylic resin does not attack the vinyl phenolic sheet and similarly, the means for removal of the vinyl phenolic sheet does not disturb the acrylic. The removal methods will be discusssed hereinafter as the description of the process proceeds.

In the next step 25, the index or alignment holes are reamed and the through holes are drilled. The acrylic and the phenolic masks prevent burrs on both sides of the boards during drilling, therefore providing high quality holes. The acrylic coating additionally provides mechanical support to the pads on the 001 circuit side of the board and prevents tearing or lifting of these pads as a result of drilling. It has also been found that the acrylic coating does not contaminate the holes as a result of drilling. As mentioned above, the clear acrylic resin permits the pads to be observed during drilling, thereby eliminating blind drilling. It also permits a check on numerically controlled drill alignment, if used, and permits the boards to be drilled by hand.

During the next step 27, the laminated boards are placed in an etching solution which will remove any epoxy smear or loose fibers caused by drilling which may overlay the pads on the circuits, and especially, those pads on the internal circuits. The etchback also provides a surface which will accept electroless copper. The etchback solution contains components which will etch epoxy and other components which will etch glass. For example, mixtures of concentrated acids, such as sulfuric and hydrofluoric, may be used. The acrylic coating and vinyl phenolic mask have been found to be compatible with these acids and are not attacked thereby.

The next step 29 involves the deposition of electroless copper which provides a conductive coating or blanket over the entire board and coats the surface of the through holes so that they will accept eletcrolytic plating. The electroless copper also forms a blanket over the acrylic mask on the boards. In the next step 31, the acrylic mask is removed thereby removing this blanket. It has been found that a fluorocarbon hydrocarbon solvent is an effective agent for removing the acrylic coating without affecting the vinyl phenolic mask on the side of the board which has the 004 circuit thereon, nor damage the hole deposition. The suitable solvent may be an azeotropic blend of Freon brand fluorocarbon and methylene chloride, such as sold under the trade name "Freon TMC" by the E. I. du Pont de Nemours, Inc. of Wilmington, Del. After the solvent is applied, the surfaces are lightly scrubbed with a brush to insure that the surface copper conductors (on the exposed 001 circuit) are clean.

The next step 33 is electrolytic plating, preferably with copper in a copper pyrophosphate plating bath. The copper foil layer 18 (FIG. 4) insures plating continuity to all the electroless copper deposited in the holes which in turn has continuity with the exposed circuit. To this end, an area of the vinyl phenolic mask 16 may be notched to provide connection to the copper foil; the vinyl phenolic sheet 16 serves as a solder plating mask upon the foil. After copper plating, a solder plate 35 is applied. Solder plating is performed in accordance with conventional techniques until the requisite plating thickness is obtained.

The post plating operations involve first the step 37 of applying a spray coating of the acrylic resin mentioned above to the side of the board having the 001 circuit. This coating is a third mask which serves to protect the exposed circuit during handling and subsequent etching away of the copper foil 18. It also reduces pickup of moisture during the next step 39 when the vinyl phenolic mask is stripped away. The vinyl phenolic mask is readily stripped in the step 39 by immersing the boards in hot water, say about 200° F. for a few minutes. The sheet 16 will then readily peel or lift off in one piece leaving the surface of the copper foil 18 clean.

There may be some protuberances or plating stems around the holes on the foil 18 side of the board. These are removed in the next step 41, say with emery paper. The copper foil layer 18 is touched up by hand sanding, if necessary.

The copper foil 18 is then etched away in the next step 43. This may be accomplished with a normal copper etchant such as ferric chloride solution. The acrylic spray coating serves as a reliable etch mask. After etching, the board is cut to size (step 45). Finally, in step 47, the acrylic coating is stripped by emersion in the above noted Freon TMC solvent, desirably followed by an emersion in another pure fluorocarbon solvent, such as that sold by the E. I. du Pont de Nemours, Inc. under the trade name "Freon TF." The board is then cleaned as by scrubbing, rinsed and dried. After drying, the board is complete and ready for use.

Figure 2:
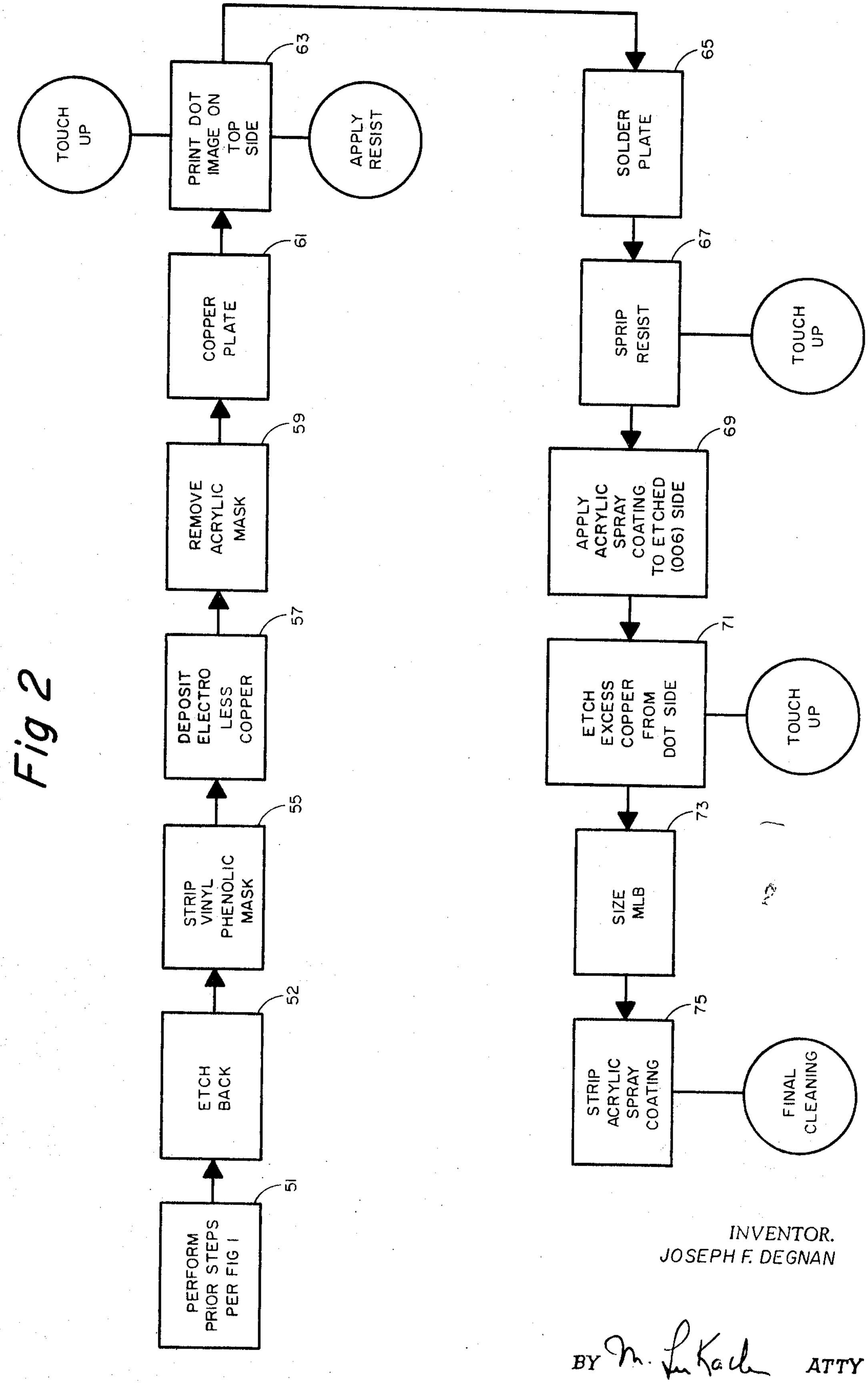
FIG. 2 is a flow chart similar with FIG. 1 showing another method of making a printed circuit board, both the method and the board being in accordance with another embodiment of the invention.
Figure 5:
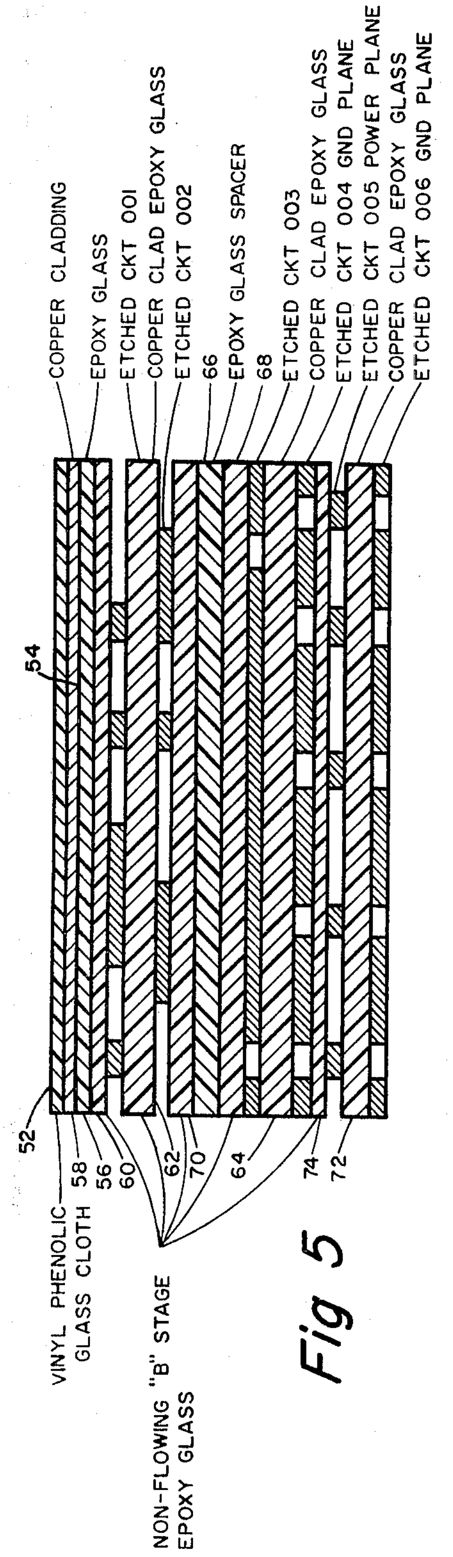
FIG. 5 is a sectional view of a package similar to the package shown in FIG. 4 from which a multilayer printed circuit board may be made in accordance with the process depicted in FIG. 2.

Referring next to FIG. 2, there is shown a method for making a multi-layer printed circuit board in accordance with another embodiment of the invention. Features of the invention are also embodied on the board itself. In the process, a first group of steps 51 consisting of the steps 10, 12, 14, 17, 19 and 21, 23 and 25, as described in connection with FIG. 1 may be performed. The lamination packages are each made up of the boards and sheets shown in FIG. 5 which are depicted in the order in which they are disposed in the lamination fixtures as shown in FIG. 3. The uppermost layer is a sheet 52 of vinyl phenolic glass cloth which is the counterpart of the sheet 16 as shown in FIG. 4. The next sheet is a single sided board 54 having an epoxy glass substrate layer 56, say 0.005 inch thick which is clad with copper on one side. The copper cladding layer 58 of the board 54 serves the same purpose as the copper foil layer 18 (FIG. 4) and, in addition, provides a surface for a circuit pattern; specifically, a pattern of pads through which the plate holes may extend and which provide means for connection of other circuit components to the board.

Next, a sheet 60 of non-flowing "B" stage epoxy glass similar to the sheet 20 is provided for bonding the board 54 to an adjacent double sided board 62. The board 62 has a substrate of epoxy glass on which the 001 and 002 circuits are etched. Another circuit board 64, similar to the board 62 is then provided. This board is separated from the board 62 by a sandwich of an epoxy glass spacer 66, similar to the spacer 30 (FIG. 4), and sheets 68 and 70 of non-flowing "B" stage laminate. Either a spacer such as the spacer 66, or a few sheets (say 3 sheets) of "B" stage epoxy glass cloth may be used. In the package shown in FIG. 4, sheets of "B" stage epoxy glass cloth may be used instead of the spacer 28, if desired. The sandwiched spacer is preferred.

Figure 6:
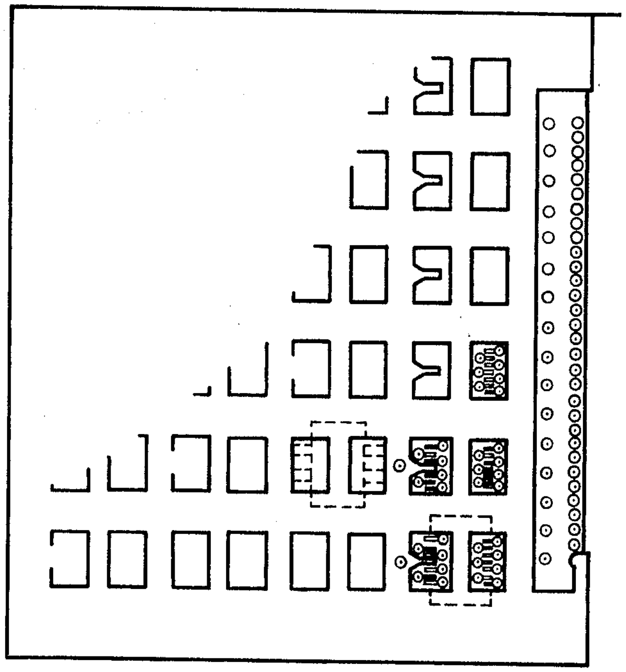
FIG. 6 is a plan view of the multilayer printed circuit board which is formed from the package shown in FIG. 5.

The 004 circuit provides a ground plane for shielding the other circuits in the board against the induction therein of unwanted signals and further cooperates with a power plane circuit 005 which is provided on a third board 72 of the assemblage. The third board also has as the outer surface of the boards a 006 circuit which provides another ground plane. A non-flowing "B" stage epoxy glass sheet 74, which is desirably thinner than the other "B" stage epoxy sheet used in the assemblage, is disposed between the adjacent circuits 004 and 005 of the boards 64 and 72. The 004 and 005 circuits, together with the "B" stage sheet, form a capacitor which functions as a bypass capacitor in the circuit provided by the board and the components mounted thereon. The use of the non-flowing "B" stage epoxy sheet 74 and conformal pressure during lamination precludes shorting between the 004 and 005 planes, notwithstanding that the sheet is very thin (.002 in.). Thus, the board has the additional feature of providing bypass or decoupling capacitor action, as well as connections between circuit elements. The 006 circuit is utilized as the top of the board upon which circuit components, such as flat pack microcircuit devices, may be mounted. This surface is shown in FIG. 6. Again, the 006 circuit functions as a ground plane or shield.

After the foregoing steps have been completed, the board is subjected to an etchback step 53, which may be practiced in a manner described above in connection with step 27, FIG. 1.

Immediately after a completion of the final etchback rinse, the step 55 of removing the vinyl phenolic mask 52 is accomplished. The procedure is the same as was discussed above in connection with step 29 (FIG. 1). In the next step 57, electroless copper is deposited. This time the electroless copper coats the holes and again provides continuity between the copper layer and the opposite side exposed circuit layer (006).

The acrylic mask is removed in the succeeding step 59 by means of the Freon TMC solvent, as was discussed in connection with step 31 (FIG. 1). The boards are then copper plated. The copper plating step 61 is performed in the same way as the plating step 33 (FIG. 1). The copper layer 58 provides good continuity in the same way as the copper foil. The surface of the copper layer may be lightly sanded, scrubbed and dried in preparation for printing of a pattern, specifically the pattern of dots around each of the plated through holes. Prior to printing, a solder resist coating is applied to the plated surface of the copper layer 58. A suitable resist material may be a silk screen ink, Wornow Process, Inc. series M is suitable. After the resist image is printed, the board may be touched up, if necessary, to prevent any pin-hole plating breakdown. Since the resist is silk screened and the holes are covered by the screen, the holes are not contaminated. In this connection, it may be noted that the process of construction of boards where all of the circuits are prefabricated prior to lamination and no post lamination circuits or patterns are produced is preferable in that it avoids defects as may arise during this post-drilling printing process.

After the dot pattern is printed, the boards are solder plated. Solder adheres to the conductive images, not to the resist. The solder plating step 65 is followed by a step 67 of stripping the resist with a suitable solvent which does not attack the solder plating. The boards are clean and the side on which the dot image is printed is touched up to remove excess solder.

In the next step 69, a protective acrylic spray coating is applied to the 006 etched circuit side of the boards; the reasons for applying this coating were explained in connection with step 37 (FIG. 1). The coating is allowed to dry.

In the next step 71, the board is immersed in a copper etchant, such as ferric chloride solution, so as to remove any excess copper from the dot pattern side of the boards. The boards in the next step 73 are cut to size. Any holes which are to function as non-plated holes are drilled as required.

In the final step 75, the acrylic spray coating is removed, as was explained in step 47 (FIG. 1), and the boards rinsed and cleaned for inspection and delivery.

From the foregoing description, it will be apparent that there has been described improved multi-layer printed circuit boards and methods of making same. While two types of boards embodying the invention have been described, both having only one exposed circuit layer which are fabricated prior to lamination, and one type having a master dot pattern on the opposite side having no surface circuit pattern, together two embodiments of the process, each for making a different one of these board types, it will be appreciated that modifications and variations within the scope of the invention or which utilize the features thereof will present themselves to those skilled in the art. Accordingly, the foregoing description should be taken merely as illustrative and not in any limiting sense.

What is claimed is:

1. The method of making multilayer printed circuit boards from a plurality of circuit boards, at least some of which have circuit patterns on at least one side thereof comprising the steps of sandwiching substantially non-flowing B stage epoxy glass cloth sheets between said boards to provide an assembly, locating one of said boards having a circuit pattern on one side thereof so that said circuit pattern side is exposed on one side of said asembly, laminating said assembly of boards together, drilling through-holes through said laminated assembly from said exposed circuit side thereof, and forming connections among said circuit patterns via said holes.

2. The invention as set forth in claim 1 including the step of prior to forming said connections, of applying a clear removable coating over said exposed circuit side.

3. The method of making multilayer printed circuit boards from a plurality of boards of electrically insulating material clad with conductive material, the conductive cladding on at least some of said bored being formed with circuit patterns, said method comprising the steps of stacking said boards and sheets of adhesive material, such said adhesive material is disposed between adjacent surfaces of said boards and such that a layer of conductive material is disposed on at least one outside surface of said stack and a circuit pattern is exposed on the opposite surface of said stack, providing a layer of vinyl phenolic glass cloth over said exposed layer of conductive material in said stack to form a lamination package, laminating said package together so as to bond said layers and said boards to each other to form an assemblage, applying a mask to at least said exposed circuit pattern surface, drilling a plurality of holes between opposite surfaces of said assemblage, coating said assemblage with conductive material so as to provide a conductive coating on the surfaces of said holes, thereafter removing said mask, then plating conductive material upon said conductive coating, and removing said vinyl phenolic layer either prior to or after plating.

4. The invention as set forth in claim 3 wherein said conductive layer is a sheet of copper foil.

5. The invention as set forth in claim 4 wherein said adhesive sheets are of substantially non-flowing B stage epoxy glass cloth, and including the step of providing at least one other sheet of substantially non-flowing B stage epoxy glass cloth between said copper foil and the circuit board adjacent thereto in assembling said stack.

6. The invention as set forth in claim 3 wherein said mask is an acrylic resin.

7. The invention as set forth in claim 6 including the steps removing said first mask after applying said conductive coating, applying another mask of acrylic resin material to said assemblage after plating is applied, thereafter removing said vinyl phenolic layer without removing said other mask, removing said conductive layer, and thereafter removing said other mask.

8. The invention as set forth in claim 6 wherein said step of removing said vinyl phenolic layer is accomplished by immersing said laminated package in hot water, and thereafter peeling said vinyl phenolic layer from said laminated package.

9. The invention as set forth in claim 3 wherein said mask is an acrylic resin material, and wherein said step of removing said mask includes immersion of said package in a solvent for said acrylic resin.

10. The invention as set forth in claim 3 including the step of etching said holes, then removing said vinyl phenolic layer then applying said conductive coating, thereafter removing said mask, then electrolytically plating said holes with conductive material.

11. The invention as set forth in claim 3 wherein said layer of conductive material is provided by another board having a conductive cladding thereon, and wherein said vinyl phenolic layer is removed from said cladding prior to coating of said assemblage with conductive material, and further including the step of forming a pattern on said conductive layer after said conductive coating is applied to said assemblage.

References Cited

UNITED STATES PATENTS

| | | | |
|---|---|---|---|
| 3,433,888 | 3/1969 | Tally et al. | 174—68.5 |
| 3,471,348 | 10/1969 | Shaheen et al. | 256—13 |
| 3,499,218 | 3/1970 | Dahlgren et al. | 204—15 |
| 3,508,330 | 4/1970 | Kubik | 117—212 |
| 3,509,624 | 5/1970 | Boucher | 117—212 |

JOHN H. MACK, Primary Examiner

T. TUFARIELLO, Assistant Examiner

U.S. Cl. X.R.

29—625; 117—212; 156—13; 161—165; 174—68.5